(12) United States Patent
Tossell

(10) Patent No.: US 6,876,534 B2
(45) Date of Patent: Apr. 5, 2005

(54) METHOD OF CLAMPING A WAFER DURING A PROCESS THAT CREATES ASYMMETRIC STRESS IN THE WAFER

(75) Inventor: David Andrew Tossell, Bristol (GB)

(73) Assignee: Trikon Holdings Limited, Newport (GB)

( * ) Notice: Subject to any disclaimer, the term of this patent is extended or adjusted under 35 U.S.C. 154(b) by 140 days.

(21) Appl. No.: 10/182,869

(22) PCT Filed: Dec. 4, 2001

(86) PCT No.: PCT/GB01/05357

§ 371 (c)(1),
(2), (4) Date: Aug. 1, 2002

(87) PCT Pub. No.: WO02/47126

PCT Pub. Date: Jun. 13, 2002

(65) Prior Publication Data

US 2003/0002237 A1 Jan. 2, 2003

(30) Foreign Application Priority Data

Dec. 5, 2000 (GB) .............................. 0029570

(51) Int. Cl.⁷ .............................................. H02N 13/00
(52) U.S. Cl. ....................................... 361/234; 361/233
(58) Field of Search ................................ 361/234, 233; 165/80.1

(56) References Cited

U.S. PATENT DOCUMENTS 4,692,836 A * 9/1987 Suzuki ........................ 361/234
5,267,607 A * 12/1993 Wada ......................... 165/80.1
5,325,261 A    6/1994 Horwitz
5,421,401 A * 6/1995 Sherstinsky et al. ........ 165/80.2
5,738,729 A    4/1998 Dubs
5,804,089 A    9/1998 Suzuki et al.
6,162,336 A * 12/2000 Lee ......................... 204/298.15
6,228,208 B1 * 5/2001 Lill et al. ................. 156/345.1

FOREIGN PATENT DOCUMENTS

| DE | 197 37 825 A | 3/1998 | |
| JP | 11-145265 | 5/1999 | |
| JP | 11145265 | * 5/1999 | ........... H01L/21/68 |

* cited by examiner

Primary Examiner—Brian Sircus
Assistant Examiner—Z Kitov
(74) Attorney, Agent, or Firm—Volentine Francos & Whitt, PLLC

(57) ABSTRACT

This invention relates to electrostatic clamping and associated clamps. A particular method is described of clamping a wafer, during the process that creates asymmetric stress in the wafer, to an electrostatic chuck having a concave portion in its clamping surface characterized in that the wafer is initially clamped around its periphery in a generally flat orientation and then is bowed into the concavity as the asymmetric stress is created in the wafer. It is particularly preferred that the degree of concavity of the chuck is such as to maintain a gas seal between the wafer and the chuck sufficient to allow backside cooling of the water.

5 Claims, 2 Drawing Sheets

METHOD OF CLAMPING A WAFER DURING A PROCESS THAT CREATES ASYMMETRIC STRESS IN THE WAFER

This invention relates to electrostatic clamping and clamps.

Silicon wafers are frequently thermally oxidised for semiconductor applications and, more recently, optical conductors have been formed in relatively thick layers of oxide. The oxide layers are strongly compressive in stress, but because they extend over both sides of the wafer, prior to etching, the wafers are essentially flat or, sometimes convex bowed. Electrostatic clamps for such wafers for holding the wafers firmly during processing have been proposed with either flat or convex surfaces. Good clamping, particularly at the periphery of the clamp is important because it is frequently necessary to cool the wafer by passing, for example, helium gas between the back side of the wafer and a surface connected to a thermal mass and if there is not a good clamp at the periphery this gas will leak out and the thermal conduction will be degraded or take place non-uniformly. The applicants have discovered that as an etching process consumes part of the oxide layer on the front face of the wafer, the stress forces of the greater coverage of oxide on the back side of the wafer cause the wafer to bow its edges, with the result that cooling gas escapes at the periphery. This analysis by the applicant is described below, in more detail, with reference to FIGS. 1 to 3.

From one aspect the present invention consists in a method of clamping a wafer during a process that creates asymmetric stress in the wafer to an electrostatic chuck having a concave portion in its clamping surface characterized in that the wafer is initially clamped around its periphery in a generally flat orientation and then is bowed into the concavity as asymmetric stress is created in the wafer.

The degree of concavity of the chuck is such as to maintain a gas seal between the wafer and the chuck sufficient to allow back-side cooling throughout the process.

From another aspect the present invention consists in an electrostatic clamp for clamping a wafer during etching, the clamp having a concave clamping surface wherein the concave surface is surrounded by a peripheral seating surface to allow effective clamping of the water when it is in its flat condition.

Normally only a slight concavity will be required, but the actual dimensions will be dependent on the size of wafer to be clamped and, to some extent, the degree of stress contained in the oxide or other stress layer on the wafer. It will be appreciated that the clamp could be provided with a set of clamping surfaces having respective degrees of concavity.

Although the invention has been defined above it is to be understood it includes any inventive combination of the features set out above or in the following description.

The invention may be performed in various ways and a specific embodiment will be described, by way of example, with reference to the accompanying drawings, in which.

Figure 1:
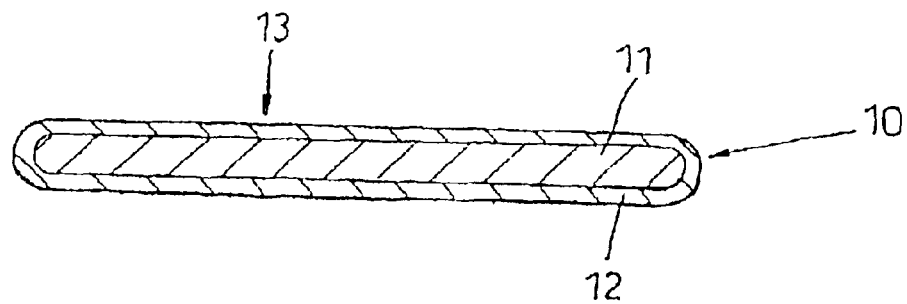
FIG. 1 is a schematic view of an un-etched wafer bearing an oxide layer.
Figure 2:
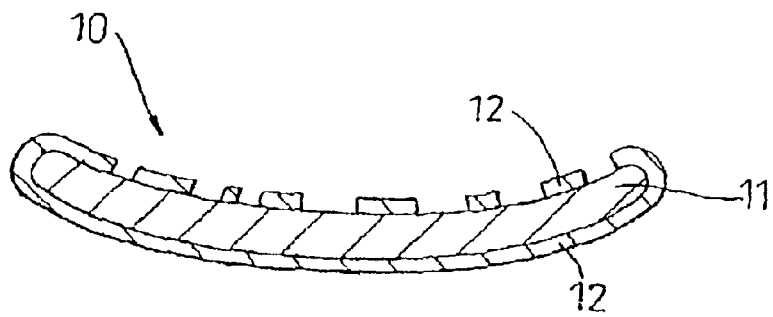
FIG. 2 is a corresponding view of the wafer after etching.

A wafer, generally indicated at 10, is illustrated in FIG. 1 and essentially comprises a silicon core 11 and an outer oxide layer 12 As the oxide layer 12 envelopes the core 11, the compressive stress within the oxide layer 12 balances out and the wafer 10 is essentially flat. However, when the upper surface 13 is etched, removing some of the oxide layer 12, then the compressive stresses become unbalanced and the wafer 10 bows upwardly as shown in FIG. 2.

Figure 3:
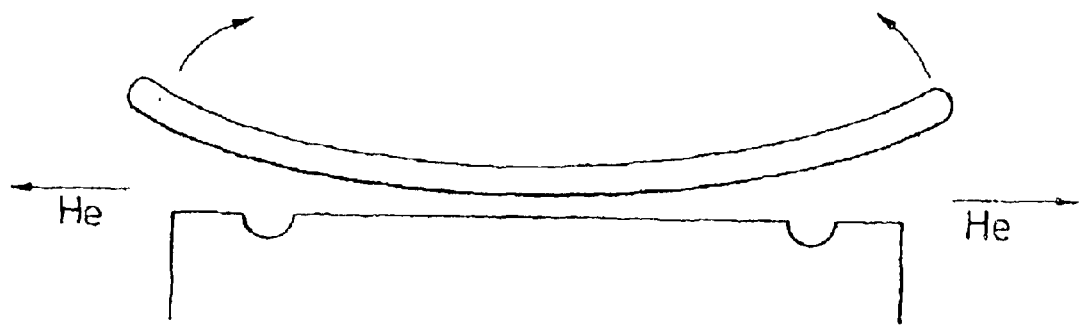
FIG. 3 is a schematic view of the wafer of FIG. 2 on a flat electrostatic clamp.

This effect was not generally appreciated and it was only when the applicants plasma etched oxide that is thicker than is usual for semiconductor applications (typically about 1 micron thick) that they discovered that as the wafer was etched there was a progressive increase in the flow of the cooling helium indicating that the clamping efficiency was reducing over time. This is illustrated in FIG. 3. Initially this was thought to be as a result of equipment problems, but when a silicon only wafer was etched for 30 minutes, there was no increase in helium flow.

Measurements were therefore taken to determine if the wafers were bowing and it was found that the bow of an un-etched wafer was less than 1 $\mu$m, whilst the bow of a wafer after a 13 minute etch was 151 $\mu$m. The applicants therefore deduced that the bowing was allowing lateral escape of helium as shown in FIG. 3.

The degree of bowing on the 100 mm wafer, which was coated with 14 $\mu$m oxide, can be seen to be excessive when compared with a 10 $\mu$m bow which is normally regarded as acceptable on a 200 mm wafer when photo-lithography is to be carried out.

Figure 4:
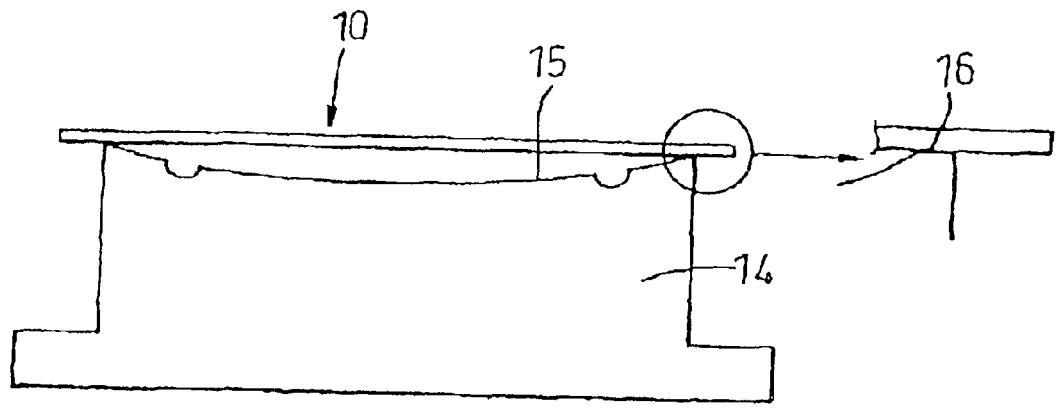
FIG. 4 is a schematic view of a wafer clamped on an electrostatic clamp with a concave clamping surface, prior to processing.
Figure 5:
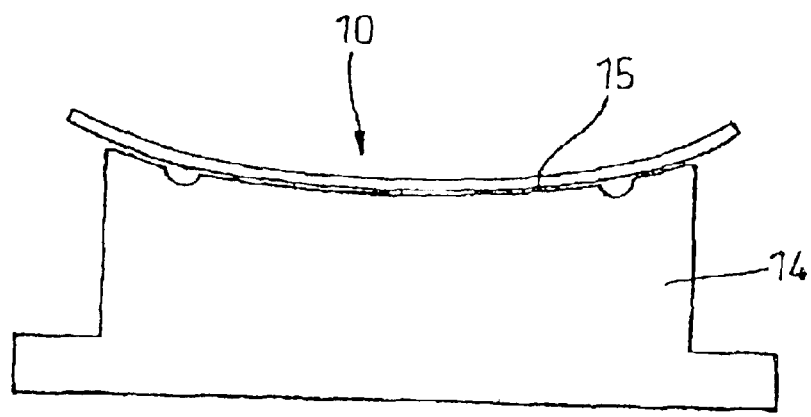
FIG. 5 is the corresponding view of FIG. 4 after some etching has taken place.

The applicants have determined that this problem can be overcome by making the upper surface of an electrostatic clamp concave to an extent which corresponds with the expected bowing. This is illustrated in FIGS. 4 and 5 wherein an electrostatic clamp 14 has a concave clamping surface 15. Initially it is possible to clamp the flat wafer 10 at the periphery of the surface 15, although an annular peripheral seat 16 may be provided, As the wafer is etched the periphery of the wafer 10 will again tend to lift away due to bowing, but the wafer will then relax down into the concavity defined by the surface 15 so that good clamping is achieved, as illustrated in FIG. 5.

Whilst the above description describes stress induced wafer bowing by the removal of a layer or part of a layer from the unclamped wafer surface it can readily be seen that the deposition of any highly stressed layer to that surface could, also create a bowed wafer that could beneficially be clamped by such a concave clamping surface.

What is claimed is:

1. A method of clamping a wafer during a process that creates asymmetric stress in the wafer to an electrostatic chuck having a concave portion in its clamping surface, the method comprising:

initially clamping the wafer around its periphery in a generally flat orientations, and etching an outer layer of the wafer so that the wafer is bowed into the concavity as asymmetric stress is created in the wafer.

2. A method as claimed in claim 1 wherein the degree of concavity of the chuck is such as to maintain a gas seal between the wafer and chuck sufficient to allow back-side cooling of the wafer.

3. A method as claimed in claim 1 wherein the process is etching.

4. A method as claimed in claim 2 wherein the process is etching.

5. A method as claims in claim 1, wherein the outer layer is an oxide layer.

* * * * *